US012588470B2

(12) United States Patent
Graf et al.

(10) Patent No.: US 12,588,470 B2
(45) Date of Patent: Mar. 24, 2026

(54) METHODS FOR ASSEMBLING STACKED SUBSTRATE PACKAGES INCLUDING DIES, LAMINATED BASE SUBSTRATES, AND DIELECTRIC BUILD-UP SUBSTRATES

(71) Applicant: Marvell Asia Pte Ltd, Singapore (SG)

(72) Inventors: Richard Graf, Gray, ME (US); Luke England, Lakeway, TX (US); Manish Nayini, Wappingers Falls, NY (US); Janak G. Patel, South Burlington, VT (US)

(73) Assignee: MARVELL ASIA PTE LTD, Singapore (SG)

( * ) Notice: Subject to any disclaimer, the term of this patent is extended or adjusted under 35 U.S.C. 154(b) by 917 days.

(21) Appl. No.: 17/652,542

(22) Filed: Feb. 25, 2022

(65) Prior Publication Data

US 2022/0270909 A1 Aug. 25, 2022

Related U.S. Application Data

(60) Provisional application No. 63/153,836, filed on Feb. 25, 2021.

(51) Int. Cl.
H01L 21/683 (2006.01)
H01L 23/00 (2006.01)
H01L 23/498 (2006.01)

(52) U.S. Cl.
CPC .... H01L 21/6835 (2013.01); H01L 23/49816 (2013.01); H01L 23/49822 (2013.01);
(Continued)

(58) Field of Classification Search
CPC ........... H01L 21/6835; H01L 23/49816; H01L 23/49822
See application file for complete search history.

(56) References Cited

U.S. PATENT DOCUMENTS

2003/0067070 A1* 4/2003 Kwon ..................... H01L 23/36
257/E23.101
2009/0309212 A1* 12/2009 Shim .................. H01L 21/6835
257/E23.012
(Continued)

OTHER PUBLICATIONS

Brewer Science, Inc., "BrewerBond® 305: Bonding Material for Mechanical and Laser Release," accessed Feb. 24, 2022 at www.brewerscience.com/products/brewerbond 305/.
(Continued)

*Primary Examiner* — Errol V Fernandes

(57) ABSTRACT

A method for assembling a stacked substrate package includes: a) binding a laminated base substrate, configured to route interconnections between first and second surfaces of the laminated base substrate, to a rigid carrier to prevent warping of the laminated base substrate; b) coupling an integrated circuit die to a dielectric build-up substrate to form a substrate stack, where the dielectric build-up substrate routes interconnections between first and second surfaces of the dielectric build-up substrate; c) coupling the second surface of the dielectric build-up substrate to the laminated base substrate; and d) releasing the rigid carrier from the laminated base substrate. At least one of: a) is performed before b) and c), b) and c) are performed at the same time, and d) is performed after a), b) and c); or b) is performed before c), c) is performed after a), and d) is performed after a), b) and c).

25 Claims, 7 Drawing Sheets

(52) U.S. Cl.
CPC ........ *H01L 23/49833* (2013.01); *H01L 24/16*
(2013.01); *H01L 24/32* (2013.01); *H01L 24/73*
(2013.01); *H01L 24/81* (2013.01); *H01L*
*2224/16225* (2013.01); *H01L 2224/32225*
(2013.01); *H01L 2224/73204* (2013.01); *H01L*
*2924/15311* (2013.01); *H01L 2924/3511*
(2013.01)

(56)                  References Cited

U.S. PATENT DOCUMENTS

| | | | |
|---|---|---|---|
| 2012/0049332 A1* | 3/2012 | Chen | ................... H01L 25/0657 |
| | | | 257/632 |
| 2015/0140729 A1* | 5/2015 | Ferro | ........................ G03F 7/30 |
| | | | 430/315 |
| 2018/0040548 A1 | 2/2018 | Kim et al. | |
| 2020/0027837 A1 | 1/2020 | Jeng et al. | |
| 2020/0075350 A1 | 3/2020 | Tsai et al. | |
| 2020/0158959 A1* | 5/2020 | Ardalan | ................ H01L 21/565 |

OTHER PUBLICATIONS

Brewer Science, Inc., "Temporary Bonding Materials: Bonding and
Debonding Product Portfolio," accessed Feb. 24, 2022 at www.
brewerscience.com/products/brewerbond-materials/.
Brewer Science, Inc., "WaferBond® HT 10.11 and HT 10.12
Materials: Temporary Bonding Materials," accessed Feb. 24, 2022
at www.brewerscience.com/products/waferbond ht 10 11 ht 10 12
materials/.

* cited by examiner

100

110

109
107

108

106

105

104

103

102

700

702 —
> Bind Base Substrate to the Carrier

704 —
> Couple the Build-up Substrate to the
> Base Substrate

706 —
> Couple the Integrated Circuit Die to the
> Build-up Substrate

708 —
> Remove Carrier from the Assembled
> Stacked Substrate Package

710 —
> Attach Surface Mount Contacts to the Bottom
> Surface of the Base Substrate

METHODS FOR ASSEMBLING STACKED SUBSTRATE PACKAGES INCLUDING DIES, LAMINATED BASE SUBSTRATES, AND DIELECTRIC BUILD-UP SUBSTRATES

CROSS REFERENCE TO RELATED APPLICATION

This disclosure claims the benefit of, commonly-assigned U.S. Provisional Patent Application No. 63/153,836, filed Feb. 25, 2021, which is hereby incorporated by reference herein in its entirety.

FIELD OF USE

This disclosure relates to the assembly of stacked substrate packages. More particularly, this disclosure relates to assembly of a stacked substrate package in a manner that avoids warping of substrate layers, which may cause misalignment of surface-mounted contacts between layers.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

A stacked substrate package includes multiple layers of substrates bearing circuitry and having contacts that must align for proper conductivity. However, when these layers of substrates are joined together, warping may result in misalignment of the contacts, resulting in a non-functional device. For example, in a single chip stacked package configuration, a single integrated circuit die will be mounted to a build-up substrate, which itself is mounted to a base substrate. Starting from the base substrate the pitch—i.e., the distance between each surface contact or pin—decreases as you go up each mounted layer. The interface of the integrated circuit die and build-up substrate is prone to warping which may cause electrical misconnections between the integrated circuit die and build-up substrate. The interface between the build-up substrate and the base substrate is also susceptible to warping during assembly. As such a stacked substrate package is assembled, bonding and electrically coupling the integrated circuit die to the build-up substrate or bonding and electrically coupling the joint between the build-up substrate and the base substrate may cause warping or bending.

SUMMARY

A method according to implementations of the subject matter of this disclosure, for assembling at least one stacked substrate package, includes binding a laminated base substrate, configured to route interconnections between circuitry on a first surface of the laminated base substrate and circuitry on a second surface of the laminated base substrate, to a surface of a rigid carrier to prevent warping of the laminated base substrate, coupling at least one dielectric build-up substrate, separate from the laminated base substrate to form a substrate stack, the at least one dielectric build-up substrate configured to route integrated interconnections between a top surface and a bottom surface of the dielectric build-up substrate, to the laminated base substrate, to each respective one of the at least one base substrate, coupling at least one integrated circuit die to the at least one dielectric build-up substrate, and releasing the rigid carrier from the laminated base substrate after coupling the at least one integrated circuit die to the at least one dielectric build-up substrate.

In a first implementation of such a method, selecting as the rigid carrier material a material that prevents warping during assembly of the stacked substrate package.

In a second implementation of such a method may further include binding the laminated base substrate may include binding at least one laminated base substrate to the surface of the rigid carrier to prevent warping of the at least one laminated base substrate A first aspect of that second implementation, wherein at least one of (a) a first interface, between a surface of one of the at least one laminated base substrate and a surface of one of the at least one dielectric build-up substrate, or (b) a second interface, between a surface of one of the at least one dielectric build-up substrate and a surface of an integrated circuit die, includes a respective one of (1) a ball grid array (BGA) on each surface of the at least one of the first interface and the second interface, (2) controlled collapse of chip connections (C4) on each surface of the at least one of the first interface and the second interface, (3) micro-bumps on each surface of the at least one of the first interface and the second interface, (4) copper pillar connections on each surface of the at least one of the first interface and the second interface, (5) a land grid array (LGA) on each surface of the at least one of the first interface and the second interface, or (6) a pin grid array (PGA) on each surface of the at least one of the first interface and the second interface.

A second aspect of that second implementation, wherein binding the at least one laminated base substrate to the rigid carrier includes adhering the carrier to the at least one laminated base substrate.

In a first instance of that second aspect, wherein adhering the at least one laminated base substrate to the rigid carrier includes adhering with an adhesive material.

In a second instance of that second aspect, wherein adhering the at least one laminated base substrate to the rigid carrier includes adhering with an organic bonding material.

In a first variant of that second instance, wherein adhering with the organic bonding material includes adhering with one of (a) WaferBOND® HT-10.11, (b) WaferBOND® HT-10.12, or (c) BrewerBOND® 305, available from Brewer Science, Inc.

In a third implementation of such a method, wherein the laminated base substrate has a first coefficient of thermal expansion and includes binding the rigid carrier to the at least one laminated base substrate comprises selecting the carrier to have a second coefficient of thermal expansion substantially equal to the first coefficient of thermal expansion.

In a third instance of that second aspect, wherein releasing the rigid carrier from the laminated base substrate includes treating the adhesive that adheres the laminated base substrate and the rigid carrier with a solvent that weakens the adhesive and physically separating the laminated base substrate and the rigid carrier that have been treated with the solvent.

In a first variant of that third instance, wherein treating the adhesive that adheres the laminated base substrate and the rigid carrier with a solvent includes immersing the rigid carrier and the base substrate, while bound together, in a solvent bath for a predetermined period of time.

In a fourth implementation of such a method, wherein releasing the rigid carrier from the substrate stack may include separating the laminated base substrate from the rigid carrier by applying torque to the stacked substrate package about an axis normal to the surface of the rigid carrier.

In a fifth implementation of such a method, wherein releasing the rigid carrier from the substrate stack may include heating the laminated base substrate to weaken adhesion of the rigid carrier to the laminated base substrate and after weakening the adhesion, separating the rigid carrier from the laminated base substrate with an in-plane force that translates the rigid carrier in parallel to the laminated base substrate.

In a sixth implementation of such a method, wherein releasing the rigid carrier from the substrate stack may include exposing the adhesive to a laser source to weaken the adhesive and after weakening the adhesive, separating the rigid carrier from the laminated base substrate.

In a seventh implementation of such a method, wherein releasing the rigid carrier from the substrate stack may include chilling the substrate stack to weaken adhesion of the rigid carrier to the laminated base substrate and after weakening the adhesion, separating the rigid carrier from the laminated base substrate with an in-plane force that translates the rigid carrier in parallel to the laminated base substrate.

In an eighth implementation of such a method, wherein the assembling of the at least one stacked substrate package further includes forming, concurrently, a plurality of substrate stacks on a rigid carrier and releasing each of the plurality of the substrate stacks, each of which are assembled to be a plurality of stacked substrate packages.

In a ninth implementation of such a method, wherein the assembling of the at least one stacked substrate package further may include applying a Thermal Interface Material (TIM) on the top surface of the integrated circuit die.

A first aspect of that ninth implementation, wherein the assembling of the at least one stacked substrate package may further include enclosing the integrated circuit die with a lid that is in thermal contact with the Thermal Interface Material.

A stacked substrate package formed by a method according to implementations of the subject matter of this disclosure, including binding a laminated base substrate, configured to route wires between a top surface and a bottom surface-mount package of the laminated base substrate, to a surface of a rigid carrier to prevent warping during assembly, coupling at least one dielectric build-up substrate, separate from the at least one laminated base substrate to form a substrate stack, the at least one dielectric build-up substrate configured to route wires between a top surface and a bottom surface mount package of the dielectric build-up substrate, to each respective one of the at least one laminated base substrate, coupling at least one integrated circuit die, having a bottom surface mount package, to each of the at least one dielectric build-up substrate and removing the rigid carrier from each respective one of the at least one stacked substrate package after coupling the at least one integrated circuit die.

In a first implementation of such a stacked substrate package formed by such a method, wherein the rigid carrier includes a material that prevents warping during assembly of the stacked substrate package.

In a second implementation of such a stacked substrate package formed by such a method, wherein binding the laminated base substrate may further include binding at least one laminated base substrate to the surface of the rigid carrier to prevent warping of the at least one laminated base substrate.

In a third implementation of such a stacked substrate package formed by such a method, wherein the laminated base substrate has a first coefficient of thermal expansion and the rigid carrier material has a second coefficient of thermal expansion substantially equal to the first coefficient of thermal expansion.

A first aspect of that third implementation, wherein the rigid carrier material includes glass.

In a fourth implementation of such a stacked substrate package formed by such a method, wherein the at least one laminated base substrate is bound to the rigid carrier with an adhesive material An apparatus according to implementations of the subject matter of this disclosure, for releasing a stacked substrate package from a rigid carrier to which the stacked substrate package is adhered, the apparatus including a base having a major plane, two secure pins, each of the secure pins having a longitudinal axis extending, in a first direction perpendicular to the major plane of the base, from a surface of the base parallel to the major plane of the base, a frame-shaped torque fixture having a major plane, the fixture being configured to surround the perimeter of the stacked substrate package and to rest on the surface of the base during a release operation, two torque lever pins, each of the torque lever pins having a longitudinal axis extending from the frame-shaped torque fixture perpendicular to the major plane of the torque fixture, in the first direction when the torque fixture is resting on the surface of the base, and a torque rod positioned between the two torque lever pins, the torque rod being configured to engage the torque lever pins to apply a torque to the frame-shaped fixture.

In a first implementation of such an apparatus, wherein the two secure pins are configured to engage two matching holes in the rigid carrier to prevent movement of the rigid carrier in a plane parallel to the major plane of the base.

In a second implementation of such an apparatus, wherein the frame-shaped torque fixture is configured to be placed onto the rigid carrier, such that the major plane of the torque fixture is parallel to the major plane of the base.

In a second implementation of such an apparatus, wherein the torque rod is configured to engage the two torque lever pins to apply to the torque fixture a torque about an axis perpendicular to the major plane, the torque fixture transferring the torque to the substrate relative to the rigid carrier.

BRIEF DESCRIPTION OF THE DRAWINGS

Further features of the disclosure, its nature, and various advantages, will be apparent upon consideration of the following detailed description, taken in conjunction with the accompanying drawings, in which like reference characters refer to like parts throughout, and in which.

DETAILED DESCRIPTION

Figure 1:
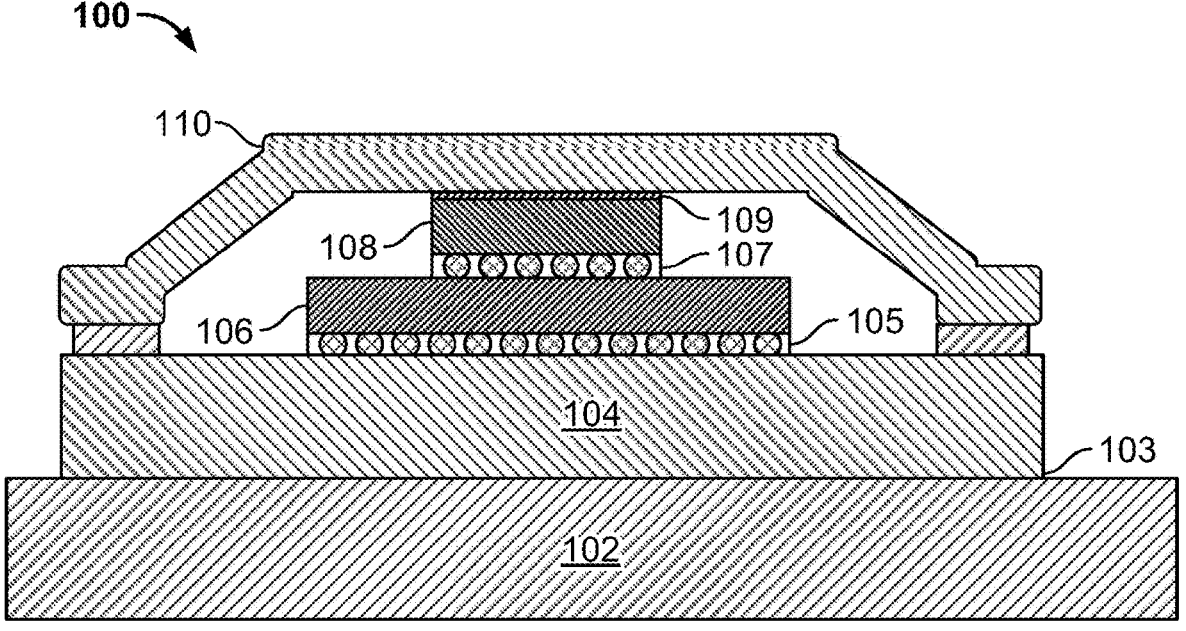
FIG. 1 is a depiction of a substrate stack mounted on top of a carrier, in accordance with implementations of the subject matter of this disclosure.

Various multi-layer package substrates are formed of a plurality of bonded together layers, such as for example ball grid arrays (BGA), land grid arrays (LGA), or pin grid arrays (PGA) are prevalent in electronic circuit fabrication for packaging integrated circuits and other electronic devices. The purpose of the base substrate is to provide a larger fan-out from the build-up substrate that it is connected to. In some implementations of the present disclosure, the base substrate is typically formed of a plurality of laminated dielectric layers. An example of a base substrate is a high-density interconnect (HDI) substrate, which uses multilayer, high-density circuits with fine line routing. The build-up substrate, when electrically coupled to an integrated circuit die, provides a layer where complex circuits may reside. This allows for more routing options for the integrated circuit die, and for high-performance routing between multiple integrated circuit dies that are mounted onto the same build-up substrate. The build-up substrate may function as a non-silicon interposer, in some implementations of the present disclosure. An interposer may allow for multiple integrated circuit dies to be mounted and electrically coupled onto the interposer. The interposer increases the fan-out from the integrated circuit dies and also allows for high-performance routing networks between the integrated circuit dies. An example of a build-up substrate that may be used is an Ajinomoto Build-up Film (ABF) substrate, which is often used for high-performance integrated circuit dice. The bonding of layers during assembly of a stacked substrate package is meant to couple and join an integrated circuit die and the substrate layers together, so that good connections between surface-mounted contacts on adjacent surfaces of the various layers can be ensured. Such surface-mounted contacts are used to make electrical connections between circuits on the adjacent layers and need to be well aligned. A typical technique for fabricating stacked substrate packages is to build up substrate layers in a stacked manner to form a stacked multi-layer substrate package. However, in some cases the stacking of substrate layers to fabricate a package may lead to warping or bending of the component substrate layers, for instance because of heat applied when bonding and electrically coupling layers in a substrate stack. Such warping or bending may occur between the base substrate and a build-up substrate or between the build-up substrate and the integrated circuit die that is mounted on top of the base substrate.

In many implementations, the substrate layers of the stacked substrate package are bound by depositing an underfill material between two layers and allowing a predetermined amount of time for the underfill material to cure, thereby bonding the layers together. The specific process of bonding and electrically coupling the stacked substrate package layers may vary based on the material composition of the two layers, the composition of the underfill material used, the distribution of the underfill, the sizes of substrates and various other environmental considerations. Although the assembly of these packages may be performed in a controlled environment to mitigate inconsistencies that lead to a drop in yield of production, warping of the substrate layers may still occur. Warping of the base substrate or the build-up substrate may make the mounting of other components more difficult and may also result in poor connections between surface-mounted contacts on adjacent layers.

In order to reduce such warping, in accordance with implementations of the subject matter of this disclosure, a temporary rigid carrier layer may be included in the substrate stack during assembly. The carrier should be rigid to resist deformation by mechanical forces as well as be unsusceptible to deformation that might otherwise result from large temperature variations (e.g., in a range from about 20° C. to about 260° C.) that may occur during reflow processes to bind and/or electrically couple the interconnects as a part of the stacked substrate package assembly process. The carrier also should be capable of being removed without deforming the package during the removal process, which, if it occurs, would negate the benefit of the presence of the carrier during package assembly. In some implementations, the rigid carrier may have a coefficient of thermal expansion (CTE) that is substantially equal to that of the base substrate that is to be mounted atop the carrier. A closely matched CTE between the base substrate and the carrier ensures that when the base substrate is adhered to the carrier, the base substrate and the carrier will expand and contract similarly as the reflow temperature varies, to minimize warping during further assembly operations.

For example, the carrier material, whether glass or some other material, should have a CTE in the range of between 6 ppm/° C. and 12 ppm/° C., depending on the CTE of the base substrate material. For base substrate materials that have a CTE close to 12 ppm/° C., an alkali-containing glass carrier may present an appropriately-matched CTE. For a base substrate material with a lower CTE, a non-alkali glass can be used as the carrier material. Although various types of glass may be used as the carrier material, any rigid material that is resistant to warping and that has an appropriate CTE may be used. Some alternative materials include, but are not limited to, silicon, ceramic, and some metals (e.g., stainless steel, aluminum, or titanium).

The order of assembly of the layers may have an impact on warping, as well as overall yield of production. In a first implementation of the subject matter of this disclosure, the build-up substrate is mounted on a rigid surface created by adhering the base substrate to the glass carrier, and the integrated circuit die is then mounted on the build-up substrate.

In this implementation, the integrated circuit die is placed onto the build-up substrate and build-up substrate is placed onto the base substrate and the surface-mounted contacts are coupled in reflow. The integrated circuit die-build-up substrate interface and the build-up substrate-base substrate interface are then underfilled, cured and the respective layers are therefore bonded at the same time. The underfill material is applied between the integrated circuit die and the build-up substrate, and between the build-up substrate and the base substrate. The underfill material is generally an epoxy resin or an acrylic material that, when cured, protects the surface-mounted contacts between the layers. In this implementation, all of the underfill material between layers are cured at the same time. The curing process is a chemical process in which the underfill material solidifies, forming a bond stronger than when the material was deposited. Curing of an epoxy resin may be a thermal process, in which the layers are exposed to a constant temperature for a period of time. Curing of an acrylic material may be a photosensitive process, in which the acrylic material is exposed to a light source with a specific wavelength to fully cure the material.

However, warping may still occur during curing process, generally between the build-up substrate and the base substrate but may also occur between the integrated circuit die and build-up substrate. In the foregoing first implementation, in which the bonds between all layers are cured at once, any such warping could result in loss of an entire substrate stack. Therefore, in a second implementation of the subject matter of this disclosure, the base substrate is bonded onto the carrier, then the integrated circuit die is mounted on the build-up substrate, then lastly the build-up substrate is mounted on the base substrate. While warping may also occur in this second implementation, this implementation may be well-suited for larger integrated circuit dies or for integrated circuit dies that have small surface-mounted contact pitch. As dies become larger or the pitch gets smaller, the margin of error in the alignment of the contacts decreases. This second implementation, in which only the integrated circuit die, and the build-up substrate are bonded and electrically coupled initially, allows more control of the alignment of contacts for good electrical connection between the integrated circuit die and build-up substrate as compared to the first implementation. However, there is a trade-off, in that in this second implementation, there may be a higher likelihood that the build-up substrate will warp because the build-up substrate is not supported by any other layer when the integrated circuit die is being mounted to the build-up substrate.

After a substrate stack has been assembled, the rigid carrier is removed. Therefore, when assembling the carrier to the base substrate, care should be taken to ensure that the adhesion between the carrier and the base substrate is not so strong that it cannot later be released, while at the same time it should be strong enough to prevent warping of the substrate stack during assembly. There are several different release methods in accordance with implementations of the subject matter of this disclosure. In accordance with some implementations of the subject matter of this disclosure, the bonding material itself is releasable, while in other implementations, the bonding material incorporates, or is paired with, a release material that facilitates breaking of the bond to remove the rigid carrier from the substrate stack.

The techniques that may be used to release the carrier from the substrate stack may rely on mechanical shear force, mechanical torque, a chemical solvent, thermal treatment, or laser exposure. In some implementations, the carrier is removed not only without damaging the substrate stack, but also without damaging the carrier, so that the carrier may be reused during assembly of additional stacked substrate packages.

One method according to implementations of the subject matter of this disclosure for release or removal of the carrier is a mechanical shear method, performed at room temperature. To facilitate this method, the bonding material used to adhere the base substrate to the carrier may be paired with a release material, which allows the two layers to physically separate from each other under shear forces, without weakening the bond between the carrier and base substrate so much that it cannot prevent warping. While mechanically separating the carrier may cause some stress on the substrate stack, this method does not require any heat or chemical treatment, which expose the stacked package to further possibilities of warping or defects. Some characteristics of bonding materials that may be considered for this mechanical release method may be thermal stability, the ability of the material to release without damaging the substrate package, and the amount of material residue that may be left on the surface of the base substrate after carrier removal. If any residue of the bonding material remains after carrier removal, the residue may interfere with contact between surface-mounted contacts on the underside of the base substrate and any printed circuit board to which the stacked substrate package may later be mounted.

In a still further implementation of the subject matter of this disclosure, mechanical torque may be applied to the substrate stack in order to remove it from the rigid carrier. In this case, a force is applied parallel to the plane of the of the base substrate to cause a torque about an axis perpendicular to that plane. Such an implementation may be carried out using a purpose-built apparatus that holds the carrier in place while applying the torque to the substrate stack via a frame that is fitted around the substrate stack. This implementation may be further facilitated by bonding the base substrate to the carrier using a bonding material that is strong in a translational mode (whether parallel or perpendicular to the plane of the bond) but weaker in a torsional mode, so that the rigid carrier may be removed when desired while avoiding possible separation of layers of the substrate stack under normal conditions in which the application of torque is unlikely.

Another release method according to implementations of the subject matter of this disclosure is a chemical solvent release method. In this method a solvent is used to chemically break down the bonding material, without affecting the remainder of the package or any circuits formed thereon. The solvent used in this process may include, but is not limited to, alcohols (e.g., methanol, ethanol, isopropanol, etc.) and inorganic acids (e.g., nitric acid and hydrochloric acid, etc.). In this method, the carrier may be perforated to allow the solvent to better penetrate the bonding material. The solvent may be applied by submerging the stacked package in the solvent for a predetermined amount of time, after which the bonding material will have broken down sufficiently to allow the carrier to be separated from the substrate stack without damaging the stack. The predetermined amount of time for the substrate stack to release from the carrier may range from 5 minutes to 90 minutes, depending on the solvent used, the solvent bath temperature, and the thickness of the applied bonding material.

Still another release method according to implementations of the subject matter of this disclosure is a temperature treatment method in which the assembly, including the carrier, is heated until the bonding material between the carrier and base substrate weakens. After the bonding material has been weakened, the carrier may be translated relative to the substrate stack to remove the rigid carrier from the substrate stack. For implementations in which this heating treatment is used, a bonding material is selected which weakens at a temperature that, while high, is low enough to avoid damage to the assembled package, including avoiding inducing warping. In some implementations, a bonding material that begins to weaken or break down when raised to a temperature at or above 190° C. may be used.

Alternatively, another form of temperature treatment may be used for carrier removal according to some implementations of the subject matter of this disclosure. In this alternative temperature treatment, the substrate stack and rigid carrier are cooled until the bonding material between the carrier and the base substrate weakens. Once the bonding material has weakened, the carrier may be removed by physically translating the carrier relative to the substrate stack. For implementations in which this cooling treatment is used, a bonding material is selected which weakens at a temperature that, while low, is high enough to avoid damage to the assembled package, including avoiding inducing warping.

If the location joint between the carrier and the base substrate allows exposure to a laser, then in yet another method according to implementations of the subject matter of this disclosure, laser exposure may be used to release the rigid carrier from the base substrate. For example, a suitable laser may be a middle-wave to long-wave ultraviolet laser with a wavelength between 248 nm and 355 nm. Such a method may be used with a rigid carrier material, such as glass, that is transmissive in the wavelength of the laser in order to allow the laser to transmit through the carrier. Alternatively, this method may be used with a carrier that is opaque to the laser wavelength, as long as the joint can be exposed (e.g., at an edge) to the laser. This method also employs a release material that interacts with the adhesive bonding material to facilitate the weakening of the adhesive bonding material. The laser may release the bonding material (as altered by the release material) by thermal action (in which case the bonding material should be chosen according to criteria discussed above), or by breaking down chemical bonds in the bonding material (e.g., by ablation). Even in the case of thermal action, the carrier removal temperature from laser exposure should not result in base substrate warping and may be a low stress carrier removal option.

Various organic bonding materials are available that may be used to adhere the base substrate to the carrier while allowing removal of the carrier by one of the foregoing removal techniques. For example, suitable organic bonding materials are available from Brewer Science, Inc., of Rolla, Missouri under the trademarks WaferBOND®-HT-10.11, WaferBOND® HT-10.12, and BrewerBOND® 305. While each of those bonding materials may be suitable for mechanical shear or torque removal techniques, the Wafer-BOND®-10.11 material is particularly well suited for temperature-base or chemical-based removal techniques when the base substrate has a thickness less than 75 microns, while the WaferBOND® HT-10.12 material is particularly well-suited for temperature-based or chemical-based removal techniques when the base substrate has a thickness greater than or equal to 75 microns. On the other hand, the Brew-erBOND® 305 material is particularly well-suited for laser based or mechanical (shear or torque) removal techniques.

FIG. 1 illustrates the different layers of a substrate stack 100 which is attached to a rigid carrier 102 during fabrication. A base substrate 104 is adhered to the carrier 102 using a bonding material 103. In some implementations of the present disclosure, the base substrate is formed of a plurality of laminated dielectric layers, for instance a plurality of high-density interconnections (HDI) layers. A build-up substrate 106 is mounted above (in the orientation of the drawing) base substrate 104, bonded by an underfill material 105. An integrated circuit die 108 may be mounted above (in the orientation of the drawing) and electrically coupled to the build-up substrate 106, using another underfill bonding agent 107. Optionally, depending on the intended end use of the stacked substrate package 100, a Thermal Interface Material (TIM) 109 may be applied on the top surface of the integrated circuit die 108. TIM 109 may be used for better heat dissipation from the heat-producing integrated circuit die 108. As further option, a lid 110 may enclose the integrated circuit die 108, in which case TIM 109 conducts heat to the lid 110, which acts as a heat sink, helps protect integrated circuit die 108 from damage caused by mechanical handling, and provides mechanical stiffness to help resist warping of the assembled stacked substrate package 100.

Issues may arise during the assembly of stacked substrate package 100 if any of the layers warp, so that the package output I/O contacts and surface-mounted contacts (e.g., contacts 402, 404, 406; see FIG. 4) on adjacent surfaces cannot make a connection, causing an open circuit. This warping may occur during the assembly process when the layers are being bonded and electrically coupled together. Underfill bonding materials 105, 107 are distributed at the interface between base substrate 104 and build-up substrate 106 and the interface between build-up substrate 106 and integrated circuit die 108, and cured until the underfill bonding materials 105, 107 secure the layers together and allow the surface-mounted contacts 404, 406 on the adjacent surfaces to make proper contact. These layers may warp as the underfilling bonding materials 105, 107 cures because, for example, each layer may have a different coefficient of thermal expansion (CTE), which may cause the different layers to expand or contact at different rates when exposed to a change in temperature. However, carrier 102 can serve not only as a rigid surface on which to assemble substrate stack 100, but also may be selected to have a coefficient of thermal expansion that is substantially equal to that of the base substrate 104. Matching the CTE between the carrier 102 and the base substrate 104 may help prevent warping during the binding and curing of the two layers.

The interface between the carrier 102 and the base substrate 104 is joined by a bonding material 103. A release material may also be used at the interface as discussed above. The method selected for removal of carrier 102 may also determine the selection of bonding material 103 and whether a release material used in bonding of the carrier 102 and the base substrate 104.

Figure 2:
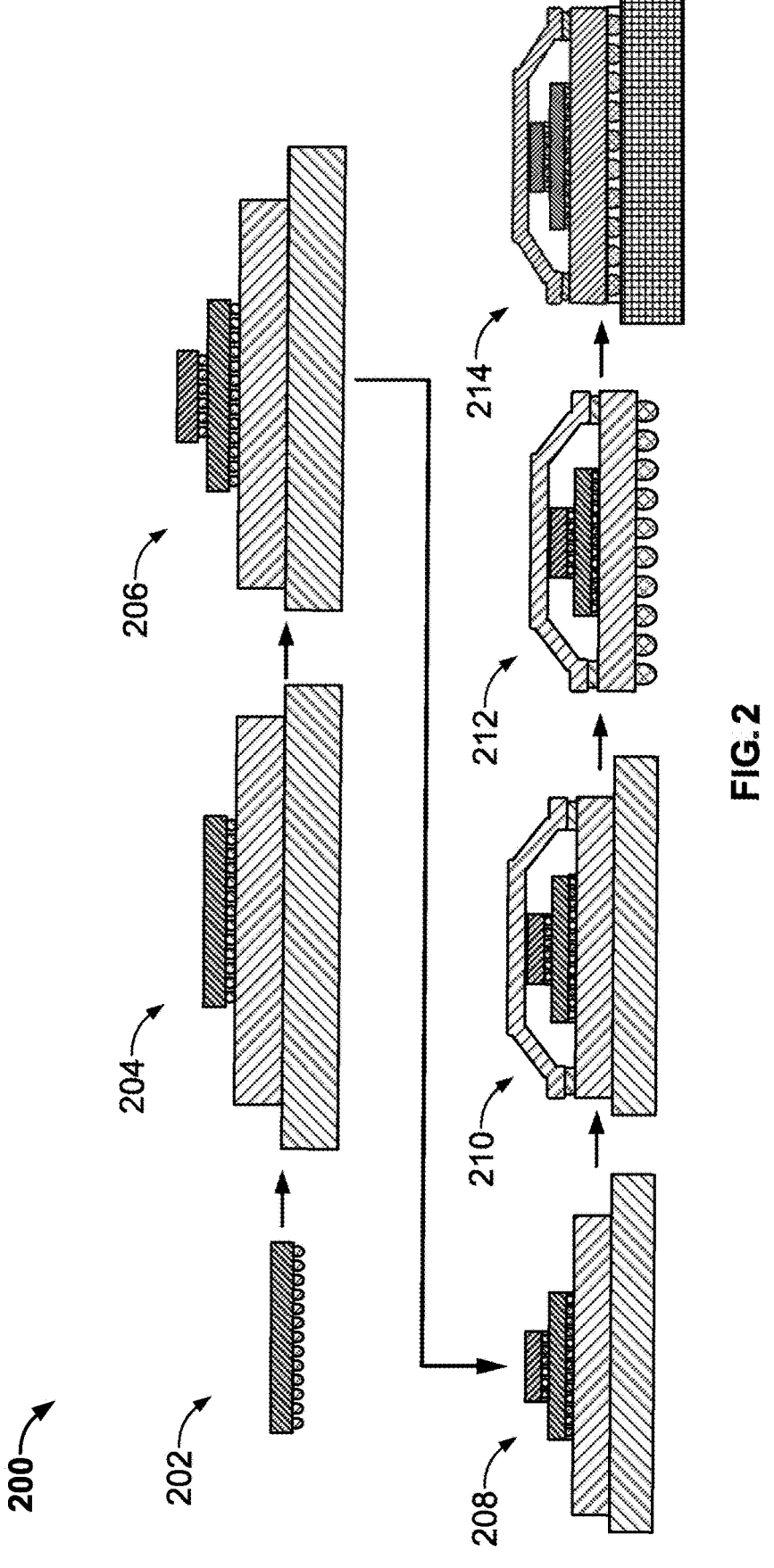
FIG. 2 shows a progression of stages of the assembly of a stacked substrate package according to some implementations of the subject matter of this disclosure.
Figure 3:
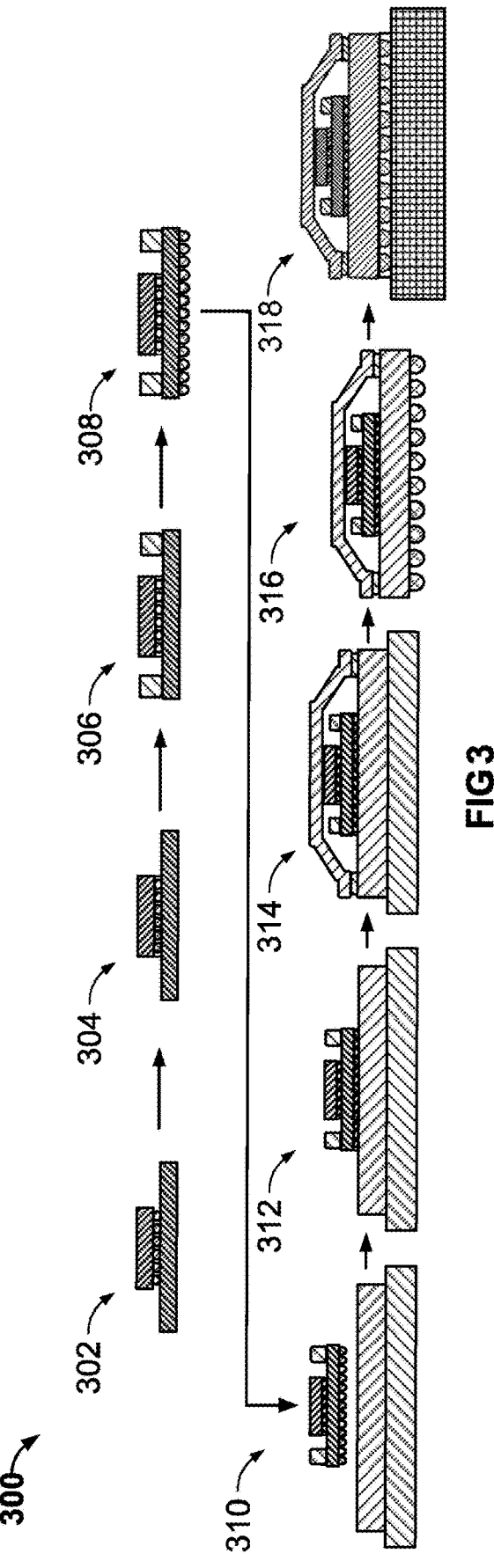
FIG. 3 shows a progression of stages of the assembly of a stacked substrate package according to another implementation of the subject matter of this disclosure.

Implementations of methods of assembling substrate stack 100 are illustrated in FIG. 2 and FIG. 3. In the implementations shown in FIG. 2, the build-up substrate 106 is mounted onto base substrate 104 and the base substrate 106 is adhered to the carrier 102 at 204. The integrated circuit die 108 is then mounted to the build-up substrate 106 at 206. To take advantage of the rigidity of the carrier 102, the build-up substrate 106 is electrically coupled and bonded to the base substrate 104 and the integrated circuit die 108 is electrically coupled and bonded to the build-up substrate at 208 by depositing an underfill bonding material 105, 107 at the build-up substrate-base substrate interface 403 (see FIG. 4) and the integrated circuit die-build-up substrate interface 405 (see FIG. 4). After the underfill bonding materials 105, 107 are cured, the surface-mounted contacts 404, 406 at the build-up substrate-base substrate interface 403 and the integrated circuit die-build-up substrate interface 405 should be aligned and bonded. Optionally, at 210, a Thermal Interface Material (TIM) 109 may be applied, and substrate stack 100 may be enclosed with a lid 110, with lid 110 in thermal contact with TIM 109. After assembly is complete, in order to provide a usable stacked substrate package, carrier 102 is removed, and at 212 package output I/O contacts 402 are formed on the bottom surface of the base substrate 104. As part of further processing the assembled stacked substrate package may be mounted and electrically coupled to a board 407 (see FIG. 4) at 214, such as a printed circuit board (PCB) for various applications.

In an implementation 300 shown in FIG. 3, assembly begins with the mounting, at 302 and coupling, at 304, of the integrated circuit die 108 to the build-up substrate 106, such that the surface-mounted contacts 406 may be connected without any open circuits. This is followed at 308 by forming surface-mounted contacts 404 on the bottom surface of the build-up substrate 106. At 310, the base substrate 104 is then adhered to the carrier 102, followed at 312 by the mount and underfill of the build-up substrate to the base substrate 104. Optionally, at 314, TIM 109 may be applied and integrated circuit die 108 may be enclosed with a lid 110. At 316, the carrier 102 is removed and package output I/O contacts 402 are formed on the bottom surface (in the orientation of the drawing) of the base substrate 104. Once the package output I/O contacts 402 are attached, the assembled stacked substrate package may be placed onto and electrically coupled to a circuit board 407 (see FIG. 4) at 318, such as a printed circuit board (PCB)

Figure 4:
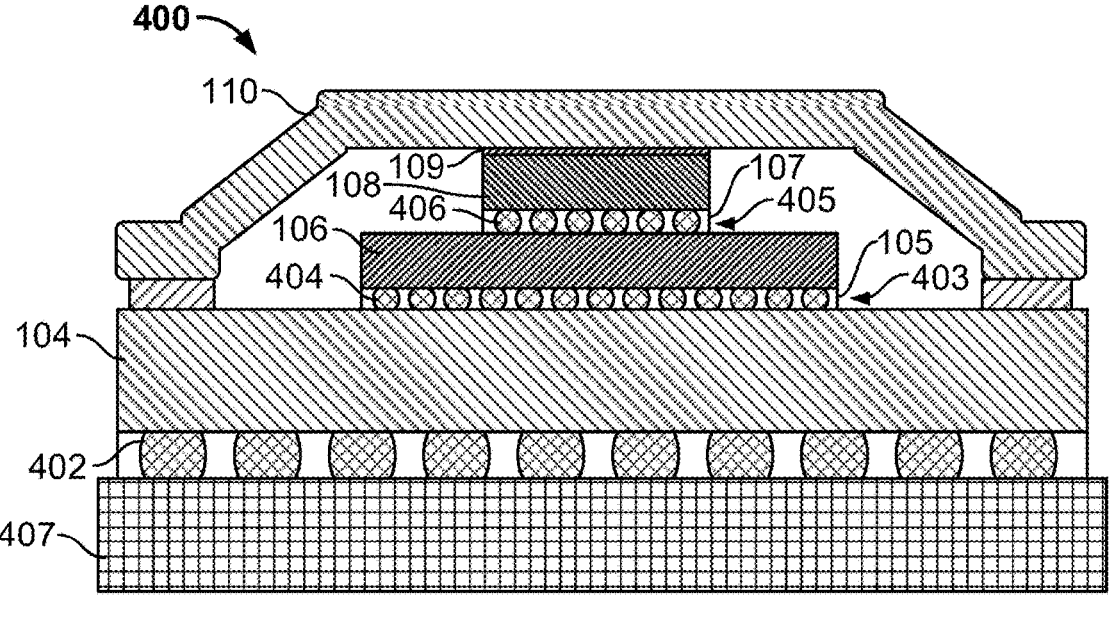
FIG. 4 is a depiction of a stacked substrate package with a ball grid array mounted on a circuit board, according to some implementations of the subject matter of this disclosure.

FIG. 4 shows a resulting stacked substrate package 400 with the carrier 102 removed, according to some implementations of the subject matter of this disclosure. Each layer of the stacked substrate package 400 has surface-mounted contacts, arranged to align with, and coupled to, circuitry on an adjacent layer. Integrated circuit die 108 has surface-mounted contacts 406 that couple to the build-up substrate 106 at the integrated circuit die-build-up substrate interface 405. In addition, the build-up substrate 106 has surface-mounted contacts 404 that couple to the base substrate 104 at the build-up substrate-base substrate 403. The surface-mounted contacts 406 on the integrated circuit die 108 may be controlled collapse of chip connection (C4) bumps, micro-bumps, or copper pillar interconnects. As seen in FIG. 4, after the carrier 102 is no longer attached to the base substrate 104, package output I/O contacts 402 are attached on the surface of the base substrate 104, allowing the stacked substrate package to be coupled electrically to a board 407 (e.g., to a printed circuit board). The package output I/O contacts 402 may be ball grid array (BGA) contacts. However, in other implementations of the stacked substrate package 400, other type of package output contacts may be used (e.g., a land grid array (LGA), a pin grid array (PGA), etc.).

Figure 5:
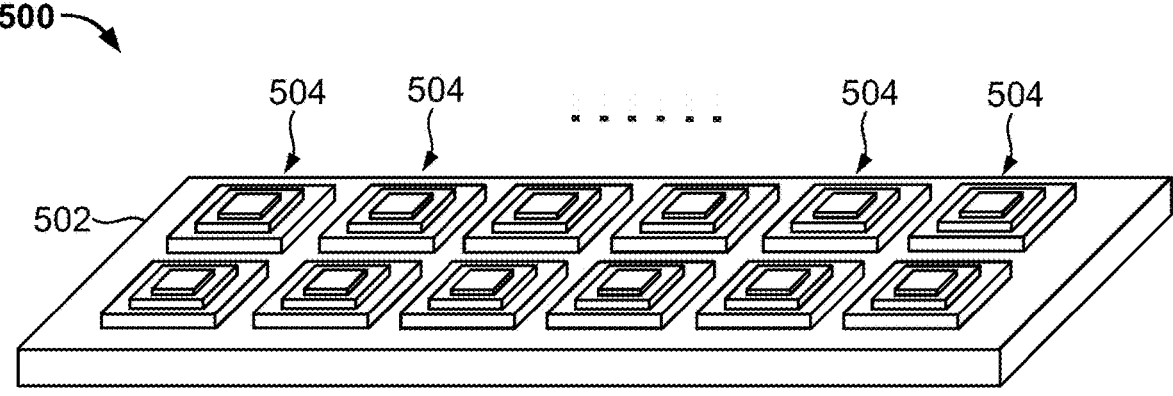
FIG. 5 is a depiction of a plurality of substrate stacks mounted on top of a carrier, in accordance with some implementations of the subject matter of this disclosure.
Figure 6:
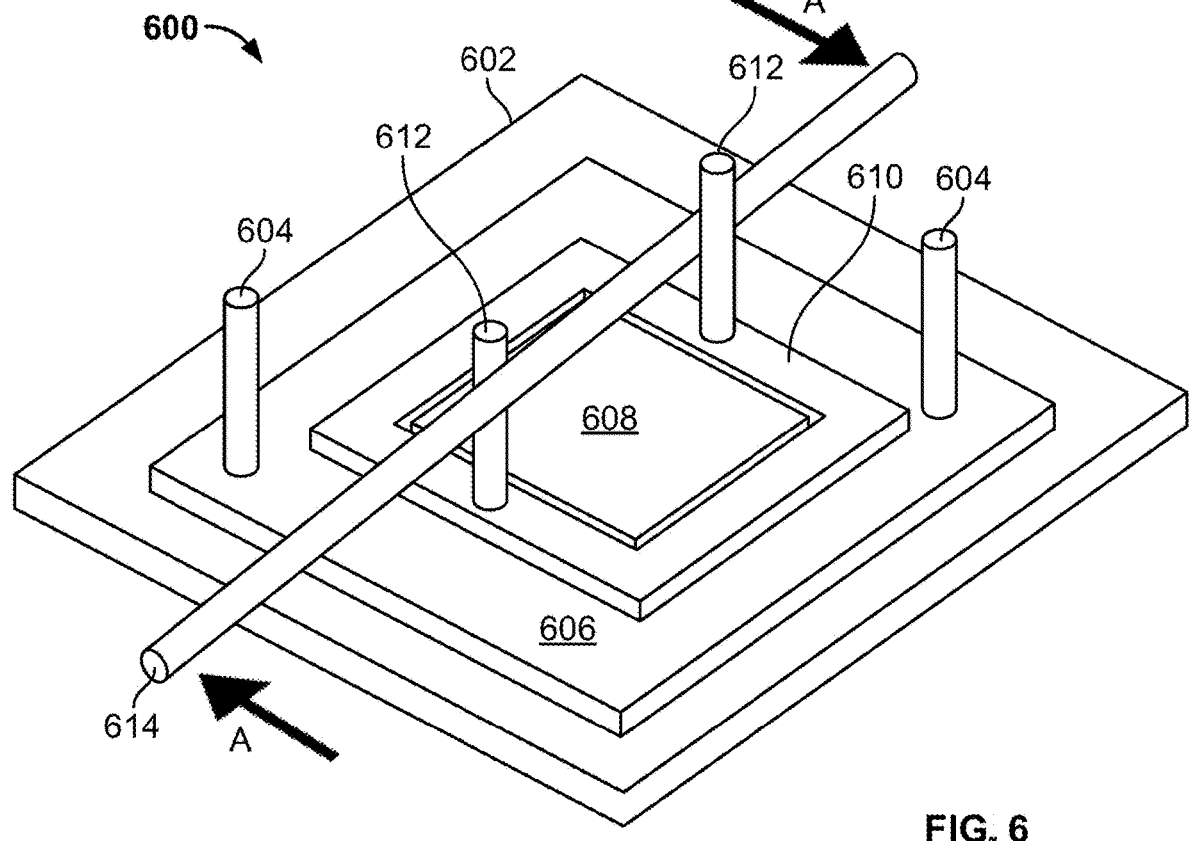
FIG. 6 is a top perspective view of apparatus used to remove a stacked substrate package from the carrier using mechanical torque, in accordance with some implementations of the subject matter of this disclosure.

FIG. 5 shows a plurality of substrate stacks 504 mounted on top of a rigid carrier 502. This illustrates how the stacked substrate package assembly process may be done in parallel to increase the production output rate. Each of the plurality of substrate stacks 504 are built up with a base substrate, a build-up substrate, and at least one integrated circuit die. Although as described so far, each implementation of the subject matter of this disclosure has been depicted as a single substrate stack, multiple individual stacks 504 may be bonded to a single carrier and processed simultaneously The mechanical torque method apparatus is seen in FIG. 6, where the base 602 is attached to two carrier secure pins 604 that extend in a direction perpendicular to the major plane of base 602. The carrier secure pins 604 are positioned to engage with two matching openings in carrier 606 in order to prevent movement in a plane parallel to the major plane of the base 600. The carrier 606 placed on the apparatus 600 will already have a substrate stack 608 assembled atop the carrier 606. Apparatus 500 also includes a frame-shaped torque fixture 610, that has a major plane, where the frame-shaped torque fixture 610 is attached to two torque lever pins 612, which extend in a direction perpendicular to the major plane of the frame-shaped torque fixture 610. The frame-shaped torque fixture 610 is positioned around the perimeter of the substrate stack 608. The torque lever pins 612 are used as points of contact for the torque rod 614, to exert forces on torque lever pins 612 in the directions of arrows A, resulting in a torque about an axis perpendicular to the major plane of frame-shaped torque fixture 610. This torque is transferred to the substrate stack 608 relative to the carrier 606, which is held in place by carrier secure pins 604 to separate carrier 606 from substrate stack 608.

Figure 7:
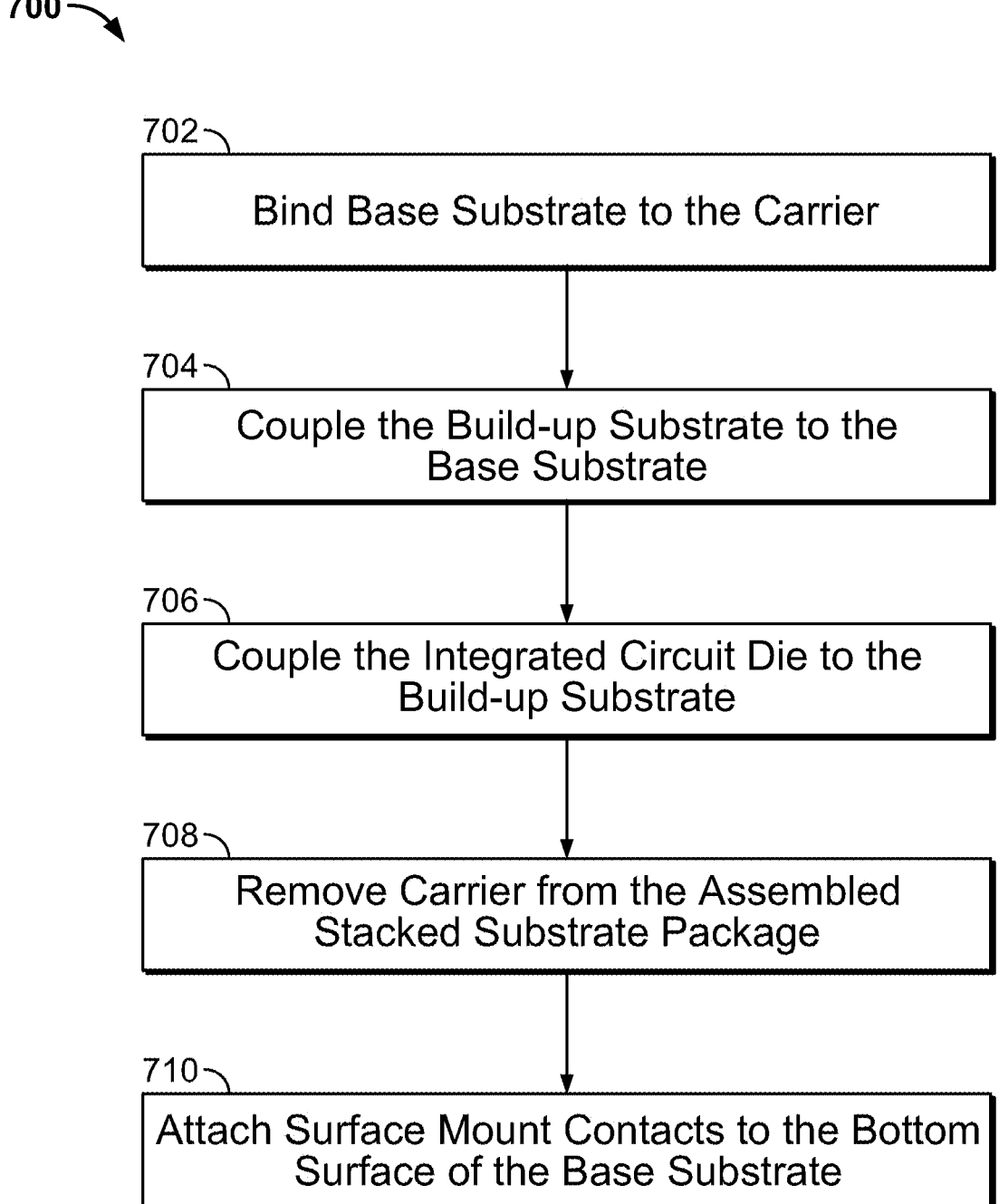
FIG. 7 shows a flowchart of the assembly of a stacked substrate package according to some implementations of the subject matter of this disclosure.

A method 700 in accordance with implementations of the subject matter of this disclosure is diagrammed in FIG. 7. Method 700 begins at 702, where the base substrate is bound to the carrier, in order to prevent warping of the base substrate. At 704, the build-up substrate is then bonded to the base substrate. At 706, the integrated circuit die is bonded to the build-up substrate 706. After all layers are assembled, at 708 the carrier is removed from the assembled substrate stack. At 710, surface-mounted contacts are formed on the surface of the base substrate 710.

Figure 8:
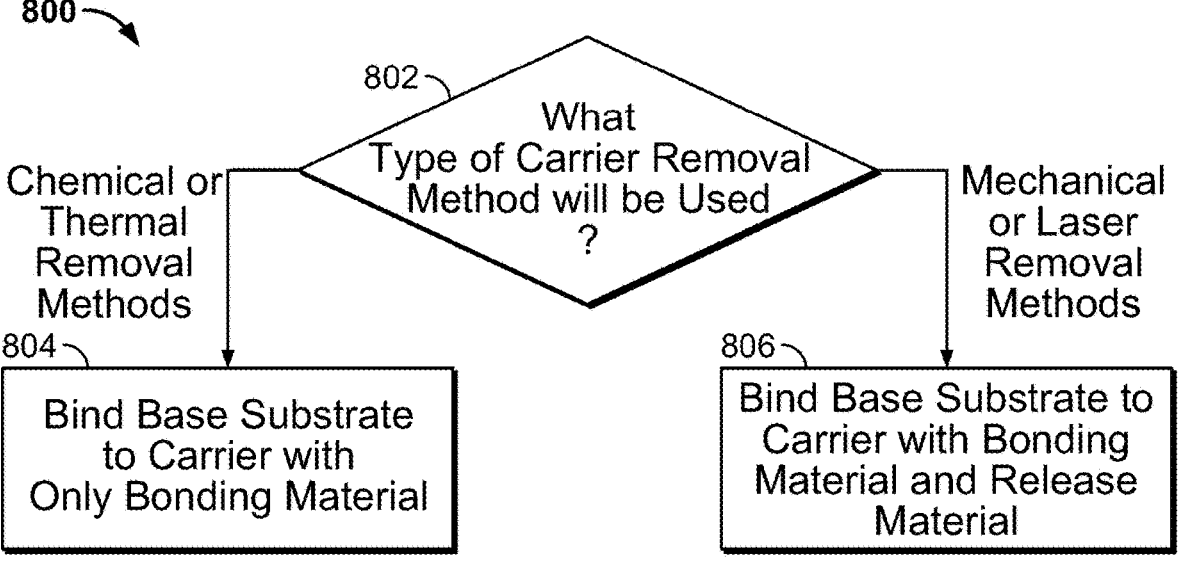
FIG. 8 shows a flowchart for the decision of which materials to use for the process of binding the base substrate to the carrier, according to some implementations of the subject manner of this disclosure.

FIG. 8 is a flow diagram showing further details of implementation of the binding of the base substrate to the rigid carrier at 702. At 802, a determination is made of the type of carrier removal method to be used at 708. If a chemical solvent or thermal treatment carrier removal methods are used, then at 804 only a bonding material is used to bind the base substrate to the carrier. If at 802 it is determined that the carrier is to be removed by laser exposure, or mechanical shear or torque, then at 806 a release material is used in conjunction with the bonding material.

Thus it is seen that the assembly of a stacked substrate package in a manner that avoids warped package layers, which may cause misalignment of surface-mounted contacts between layers, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method for assembling at least one stacked substrate package, the method comprising:

a) binding at least one laminated base substrate, configured to route interconnections between first and second surfaces of the at least one laminated base substrate, to a rigid carrier to prevent warping of the at least one laminated base substrate;

b) coupling at least one integrated circuit die to at least one dielectric build-up substrate to form a substrate stack, wherein the at least one dielectric build-up substrate is configured to route interconnections between first and second surfaces of the at least one dielectric build-up substrate;

c) coupling the second surface of the at least one dielectric build-up substrate to the at least one laminated base substrate; and d) releasing the rigid carrier from the at least one laminated base substrate, wherein at least one of:

a) is performed before b) and c), b) and c) are performed at the same time, and d) is performed after a), b) and c); or b) is performed before c), c) is performed after a), and d) is performed after a), b) and c).

2. The method of claim 1, further comprising:
selecting a material for the rigid carrier to prevent warping during assembly of the stacked substrate package.

3. The method of claim 1, wherein at least one of (a) a first interface, between a surface of one of the at least one laminated base substrate and a surface of one of the at least one dielectric build-up substrate, or (b) a second interface, between a surface of one of the at least one dielectric build-up substrate and a surface of an integrated circuit die, includes a respective one of (1) a ball grid array (BGA) on each surface of the at least one of the first interface and the second interface, (2) controlled collapse of chip connections (C4) on each surface of the at least one of the first interface and the second interface, (3) micro-bumps on each surface of the at least one of the first interface and the second interface, (4) copper pillar connections on each surface of the at least one of the first interface and the second interface, (5) a land grid array (LGA) on each surface of the at least one of the first interface and the second interface, or (6) a pin grid array (PGA) on each surface of the at least one of the first interface and the second interface.

4. The method of claim 1, wherein binding the at least one laminated base substrate to the rigid carrier comprises adhering the carrier to the at least one laminated base substrate.

5. The method of claim 4, wherein adhering the at least one laminated base substrate to the rigid carrier comprises adhering with an adhesive material.

6. The method of claim 4, wherein adhering the at least one laminated base substrate to the rigid carrier comprises adhering with an organic bonding material.

7. The method of claim 6, wherein adhering with the organic bonding material comprises adhering with one of (a) WaferBOND® HT-10.11, (b) WaferBOND® HT-10.12, or (c) BrewerBOND® 305, available from Brewer Science, Inc.

8. The method of claim 1, further comprising:
the laminated base substrate has a first coefficient of thermal expansion,
wherein binding the rigid carrier to the at least one laminated base substrate comprises selecting the carrier to have a second coefficient of thermal expansion substantially equal to the first coefficient of thermal expansion.

9. The method of claim 4, wherein releasing the rigid carrier from the laminated base substrate comprises:
treating the adhesive that adheres the laminated base substrate and the rigid carrier with a solvent that weakens the adhesive; and
physically separating the laminated base substrate and the rigid carrier that have been treated with the solvent.

10. The method of claim 9, wherein treating the adhesive that adheres the laminated base substrate and the rigid carrier with a solvent comprises immersing the rigid carrier and the base substrate, while bound together, in a solvent bath for a predetermined period of time.

11. The method of claim 1, wherein releasing the rigid carrier from the substrate stack comprises separating the laminated base substrate from the rigid carrier by applying torque to the stacked substrate package about an axis normal to a surface of the rigid carrier.

12. The method of claim 1, wherein releasing the rigid carrier from the substrate stack comprises:
heating the laminated base substrate to weaken adhesion of the rigid carrier to the laminated base substrate; and after weakening the adhesion, separating the rigid carrier from the laminated base substrate with an in-plane force that translates the rigid carrier in parallel to the laminated base substrate.

13. The method of claim 5, wherein releasing the rigid carrier from the substrate stack comprises:
exposing the adhesive material to a laser source to weaken the adhesive material; and
after weakening the adhesive material, separating the rigid carrier from the laminated base substrate.

14. The method of claim 1, wherein releasing the rigid carrier from the substrate stack comprises:
chilling the substrate stack to weaken adhesion of the rigid carrier to the laminated base substrate; and
after weakening the adhesion, separating the rigid carrier from the laminated base substrate with an in-plane force that translates the rigid carrier in parallel to the laminated base substrate.

15. The method of claim 1, wherein the assembling of the at least one stacked substrate package further comprises:
forming, concurrently, a plurality of substrate stacks on a rigid carrier; and
releasing each of the plurality of the substrate stacks, each of which are assembled to be a plurality of stacked substrate packages.

16. The method of claim 1, wherein the assembling of the at least one stacked substrate package further comprises:
applying a Thermal Interface Material (TIM) on a top surface of the integrated circuit die.

17. The method of claim 16, wherein the assembling of the at least one stacked substrate package further comprises:
enclosing the integrated circuit die with a lid that is in thermal contact with the Thermal Interface Material.

18. A method for assembling at least one stacked substrate package comprising:
a) binding at least one laminated base substrate, configured to route wires between a top surface and a bottom surface-mount package of the at least one laminated base substrate, to a surface of a rigid carrier, wherein the at least one laminated base substrate and the rigid carrier have a coefficient of thermal expansion in a range from 6 ppm/° C. to 12 ppm/° C. to prevent warping during assembly;
b) coupling at least one integrated circuit die, having a bottom surface mount package, to a top surface of at least one dielectric build-up substrate,
wherein the at least one dielectric build-up substrate is configured to route wires between the top surface and a bottom surface mount package of the at least one dielectric build-up substrate; and
c) coupling the bottom surface mount package of the at least one dielectric build-up substrate to respective ones of the at least one laminated base substrate; and
d) removing the rigid carrier from the at least one stacked substrate package,
wherein at least one of:
a) is performed before b) and c), b) and c) are performed at the same time, and d) is performed after a), b), and c); or
b) is performed before c), c) is performed after a), and d) is performed after a), b), and c).

19. The method according to claim 18, wherein the rigid carrier comprises a material that prevents warping during assembly of the stacked substrate package.

20. The method according to claim 18, wherein:
the laminated base substrate has a first coefficient of thermal expansion; and a material of the rigid carrier has a second coefficient of thermal expansion substantially equal to the first coefficient of thermal expansion.

21. The method according to claim 20, wherein a material of the rigid carrier comprises glass.

22. The method according to claim 18, wherein the laminated base substrate is bound to the rigid carrier with an adhesive material.

23. A method for assembling at least one stacked substrate package comprising, comprising:

a) coupling at least one laminated base substrate to a rigid carrier to prevent warping of the at least one laminated base substrate, wherein the at least one laminated base substrate is configured to route interconnections between first and second surfaces of the at least one laminated base substrate;

b) coupling at least one integrated circuit to at least one dielectric build-up substrate using a first ball grid array (BGA) to form a substrate stack, wherein the at least one dielectric build-up substrate is configured to route integrated interconnections between first and second surfaces of the at least one dielectric build-up substrate;

c) coupling the second surface of the at least one dielectric build-up substrate to the at least one laminated base substrate using a second BGA; and d) releasing the rigid carrier from the at least one laminated base substrate, wherein at least one of:

a) is performed before b) and c), b) and c) are performed at the same time, and d) is performed after a), b) and c); or b) is performed before c), c) is performed after a), and d) is performed after a), b) and c).

24. The method of claim 23, wherein the at least one laminated base substrate and the rigid carrier have a coefficient of thermal expansion in a range from 6 ppm/° C. to 12 ppm/° C. to prevent warping during assembly.

25. The method of claim 23, wherein the at least one laminated base substrate does not include silicon.

* * * * *